United States Patent

Mahulikar et al.

[11] Patent Number: 5,540,378
[45] Date of Patent: Jul. 30, 1996

[54] METHOD FOR THE ASSEMBLY OF AN ELECTRONIC PACKAGE

[75] Inventors: Deepak Mahulikar, Madison; Arvind Parthasarathi, North Branford, both of Conn.

[73] Assignee: Olin Corporation, New Haven, Conn.

[21] Appl. No.: 126,862

[22] Filed: Sep. 27, 1993

[51] Int. Cl.⁶ .................... H01L 21/58; H01L 23/532
[52] U.S. Cl. ................ 228/180.21; 257/666; 257/677; 257/766
[58] Field of Search .................. 228/208, 209, 228/180.21, 214; 361/813; 257/666, 677, 766

[56] References Cited

U.S. PATENT DOCUMENTS

| | | | |
|---|---|---|---|
| 3,140,530 | 7/1964 | Certa | 257/753 |
| 3,675,310 | 7/1972 | Schwaneke et al. | 228/208 |
| 3,716,421 | 2/1973 | Burkhart et al. | 228/209 |
| 3,875,652 | 4/1975 | Arnold et al. | 427/209 |
| 4,189,331 | 2/1980 | Roy | 427/118 |
| 4,387,006 | 6/1983 | Kajiwara et al. | 204/32 R |
| 4,461,924 | 7/1984 | Butt | 29/827 X |
| 4,480,262 | 10/1984 | Butt | 257/875 |
| 4,521,469 | 6/1985 | Butt et al. | 264/300 |
| 4,525,422 | 6/1985 | Butt et al. | 264/300 |
| 4,603,805 | 8/1986 | Rogers | 228/209 |
| 4,707,724 | 11/1987 | Suzuki et al. | 257/67 |
| 4,756,467 | 7/1988 | Schatzberg | 228/208 |
| 4,888,449 | 12/1989 | Crane et al. | 29/827 |
| 4,932,585 | 6/1990 | Nakamura | 228/208 |
| 4,939,316 | 7/1990 | Mahulikar et al. | 29/827 |
| 5,001,546 | 3/1991 | Butt | 257/766 |
| 5,098,796 | 3/1992 | Lin et al. | 428/658 |
| 5,103,292 | 4/1992 | Mahulikar | 257/697 |
| 5,111,277 | 5/1992 | Medeiros, III et al. | 252/720 |
| 5,119,167 | 6/1992 | Turner | 257/766 X |
| 5,122,858 | 6/1992 | Mahulikar et al. | 257/253 |
| 5,221,859 | 6/1993 | Kobayashi et al. | 257/676 |
| 5,329,158 | 7/1994 | Lin | 257/666 |
| 5,343,073 | 8/1994 | Parhasarathi et al. | 257/766 X |

*Primary Examiner*—Kenneth J. Ramsey
*Attorney, Agent, or Firm*—Gregory S. Rosenblatt

[57] ABSTRACT

There is disclosed a process for the assembly of an electronic package in which the outer lead ends of a leadframe are solderable to external circuitry without the necessity of a tin or solder coat. An oxidation resistant layer is deposited on the leadframe prior to package assembly. The oxidation resistant layer is removed prior to outer lead soldering providing a clean, oxide free metallic surface for soldering.

5 Claims, 4 Drawing Sheets

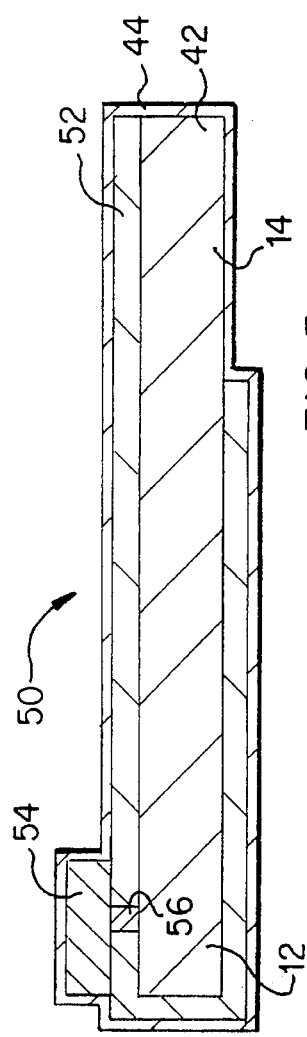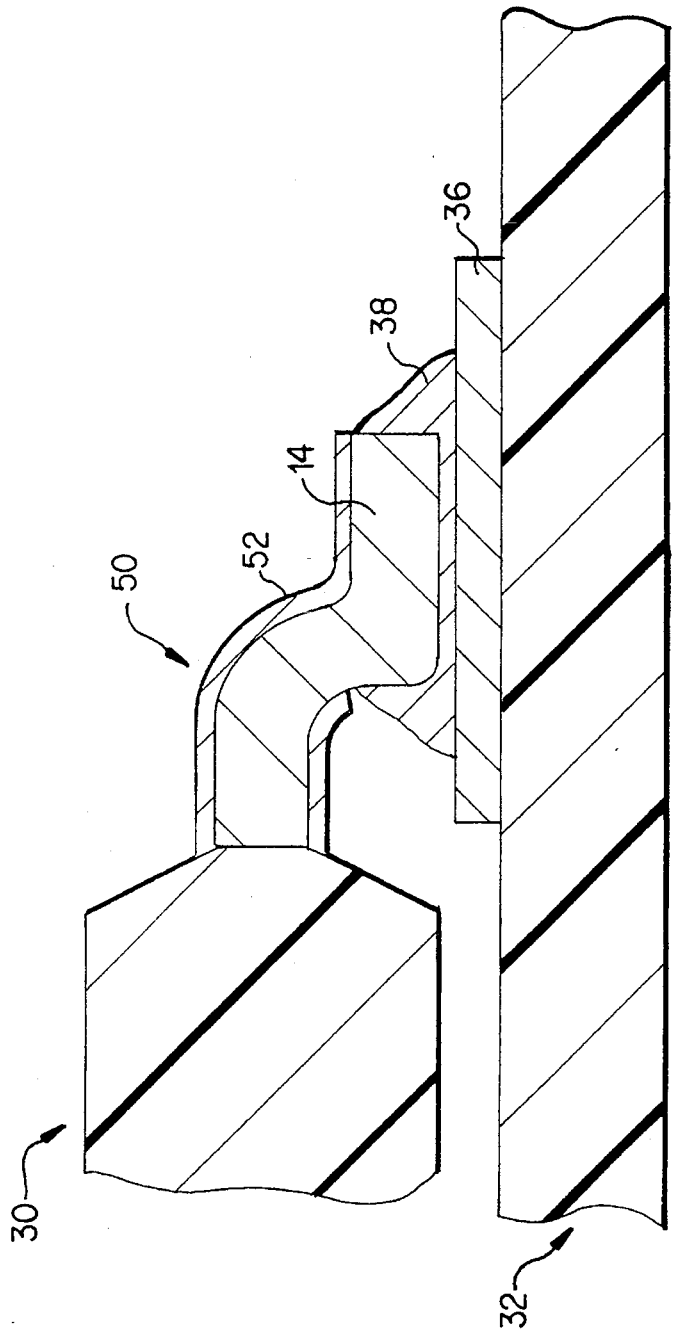

METHOD FOR THE ASSEMBLY OF AN ELECTRONIC PACKAGE

BACKGROUND OF THE INVENTION

The present invention is drawn to a method for the manufacture of an electronic package. More particularly, a leadframe is coated with an oxidation resistant layer and then that portion of the oxidation resistant layer which overlies the outer lead ends is removed generating a solderable surface.

Microelectronic circuits such as silicon semiconductor integrated circuits and hybrid microelectronic circuits require a package which both encases the circuit and provides electrical interconnection to external circuitry. A leadframe is one common means of electrical interconnection. The leadframe is formed from a strip of electrically conductive metal which is formed into a plurality of leads. The inner lead ends of the leadframe approach the integrated circuit device from one or more sides and are electrically interconnected to the device by thin bond wires. The outer lead ends of the leadframe are electrically interconnected to external circuitry such as a printed circuit board.

To protect the device from moisture and mechanical damage, the inner lead ends and the device are encapsulated. Encapsulation may be by a molding resin which surrounds both the inner leads and the integrated circuit device. Alternatively, discrete base and cover components define a cavity. When the base and cover are bonded together, the inner lead ends and integrated circuit device are encapsulated within that cavity.

Good adhesion of the inner lead ends to the molding resin is required to prevent the egress of water along the leads. Moisture can corrode the bond wires and the integrated circuit device. Additionally, the moisture accumulates inside the package. When heated, the moisture expands as steam, swelling and potentially cracking the package. This phenomenon is known as the "popcorn effect". When discrete base and cover components are utilized, the mid-portion of the leadframe is bonded to both the base and to the cover with a thermosetting epoxy or a low temperature sealing glass. Good adhesion is required to prevent the egress of moisture.

The outer lead ends of the leadframe are soldered, to external circuitry, such as a printed circuit board. These outer leads of a copper or copper alloy leadframe are solderable by removing copper oxide which formed during package assembly. Copper oxide removal is by immersion in a dilute acid. However, the copper oxide adheres poorly to the copper or copper alloy base metal and provides poor adhesion of the mid-portion of the leads to a molding resin. Better results are obtained by treating the leadframe with an adhesion promoting compound, provided, however that it is necessary that this adhesion promoting compound not detrimentally affect solderability.

Typical adhesion promoting compounds for leadframes include metals such as nickel, tin, chromium, molybdenum, aluminum and their alloys as described in U.S. Pat. No. 4,889,449 to Crane et al. Suitable polymer coatings are described in U.S. Pat. No. 5,122,858 to Mahulikar et al and include benzotriazole and ethylene vinyl acetate. The Crane et al and Mahulikar et al patents are incorporated by reference herein in their entireties.

Nickel is frequently used to coat the leads. Nickel provides an oxidation resistant coating and good adhesion to polymers. However, the elevated temperatures utilized in package assembly results in the formation of a nickel oxide layer on the outer lead ends. The nickel oxide layer is not solderable and must be removed using a strongly reducing acid such as hydrochloric acid. Hydrochloric acid can damage the molding resin and other package components and its use is not desirable.

Even if oxide free, nickel is not readily wet by lead tin solders conventionally used to mount an electronic package to a printed circuit board. Nickel coated leads are typically over coated with tin or a tin lead alloy to improve solderability. Care must be take to ensure an adequate coating of each lead, while preventing bridging between the closely spaced leads. Additionally, the electrolyte used to deposit the tin or tin lead alloy can damage the polymers used in package manufacture. As a result, the depth of package penetration in the plating bath must be accurately controlled.

SUMMARY OF THE INVENTION

Accordingly, it is an object of the present invention to provide a method for the assembly of an electronic package in which the leadframe is coated with an oxidation resistant material which both improves adhesion to a polymer and is removable for direct soldering to the leadframe substrate. It is a feature of the invention that the oxidation resistant layer contains both zinc and chromium with a zinc to chromium ratio, by weight, of in excess of about 4:1. Another feature of the invention is that the oxidation resistant layer is applied prior to encapsulation of the inner leads of the leadframe and is removed before soldering.

It is an advantage of the invention that the assembly process improves adhesion of the leadframe to electronic package components and provides improved solderability. Another advantage is that the process does not detrimentally affect the integrity of the package components. Yet another advantage of the invention is that no post encapsulation plating step is required.

In accordance with the invention, there is provided a method for the manufacture of an electronic package. The method includes the steps of:

(a) providing a leadframe having inner and outer lead ends;

(b) coating the leadframe with an oxidation resistant layer;

(c) encapsulating the inner lead ends of the leadframe; and (d) removing a portion of the oxidation resistant layer overlying the outer lead ends.

The above stated objects, features and advantages will become more apparent from the specification and drawings which follow.

IN THE DRAWINGS

FIG. 5 shows in cross-sectional representation a leadframe lead prepared according to a second embodiment of the invention.

FIG. 6 shows in cross-sectional representation the soldering of an outer lead to a printed circuit board.

DETAILED DESCRIPTION

Figure 1A:
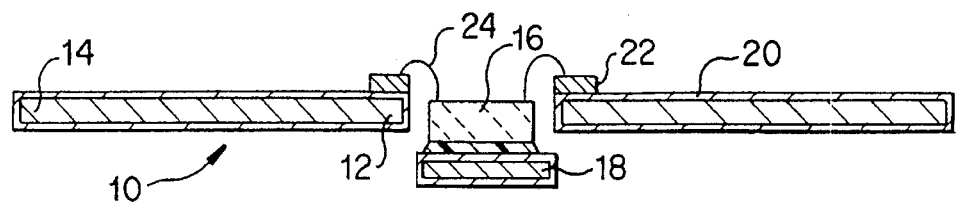
FIGS. 1A–1C shows in cross-sectional representation an electronic package assembly process as known from the prior art.
Figure 1B:
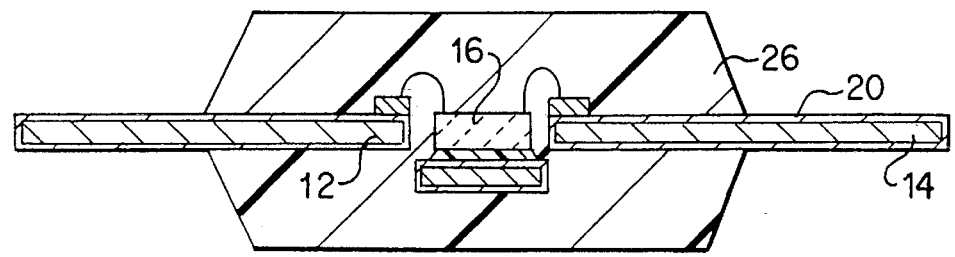
Figure 1C:
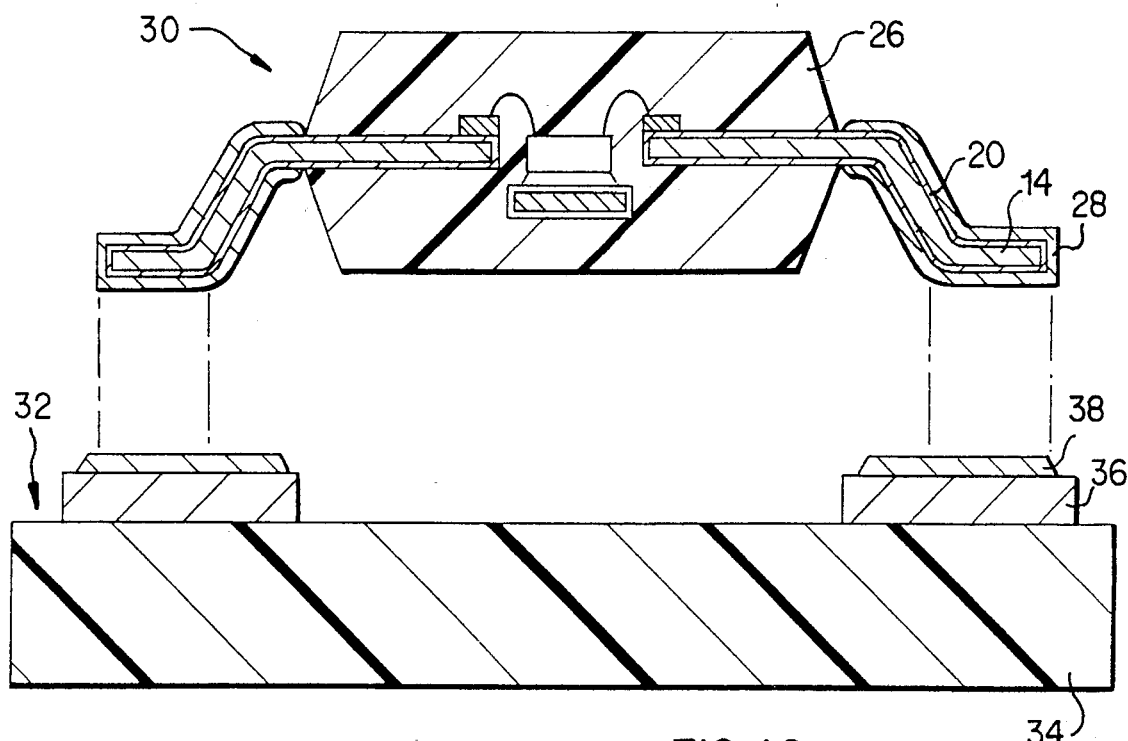

FIGS. 1A through 1C show in cross-sectional representation a process for the manufacture of an electronic package 30 as known from the prior art. A leadframe 10 has inner lead ends 12 and outer lead ends 14. The inner lead ends 12 approach an integrated circuit device 16 from one or more sides. A centrally positioned die attach paddle 18 formed from the same material as the leadframe 10 may support the device 16. The leadframe 10 is coated with an oxidation resistant nickel layer 20. A silver or aluminum stripe 22 is formed on the inner lead ends 12 to facilitate the adhesion of a wire bond 24. The wire bond 24, a small diameter copper, gold or aluminum wire, electrically interconnects the device 16 to the leadframe 10.

As illustrated in FIG. 1B, the inner lead ends 12 and integrated circuit device 16 are encapsulated in either a polymer resin 26 or between discrete base and cover components (not shown). Either encapsulation method requires heat. A typical molding cycle for a polymer resin is 175° C. for about 30 minutes. During the molding cycle, the portion of the oxidation resistant layer 20 overlying the outer lead ends 14 oxidizes. Before soldering the outer lead ends 14, the nickel oxide must be removed. Removal of nickel oxide is typically by immersion in hydrochloric acid to reduce the nickel oxide to elemental nickel. Hydrochloric acid detrimentally also attacks the polymer resin 26. Even after nickel oxide removal, the metallic nickel layer has inadequate solderability for electronic package applications. Therefore, as illustrated in FIG. 1C, the oxidation resistant layer 20 is coated with a solderable layer 28. The solderable layer 28 is any suitable metal such as tin, lead, a lead-tin alloy, gold or silver. The solderable layer 28 may be applied by electrolytic means, electroless means or by immersion into a molten metal bath. Both the chemical solutions used for deposition processes and the heat used in the immersion process can damage the polymer resin 26 necessitating extreme care during application. Additionally, any oxide remaining on the oxidation resistant layer 20 will cause a void or pin hole in the solderable layer 28, leading to inadequate soldering or a future corrosion site.

Following deposition of the solderable layer 28, the package assembly 30 is aligned with a printed circuit board 32. The printed circuit board 32 has a dielectric support layer 34 with metallic circuit trace layers 36 laminated to one or both sides of the dielectric substrate. A solder 38, usually a lead tin alloy, is deposited on the metallic circuit traces 36, such as by screen printing. The package assembly 30 is then positioned such that the solder 38 contacts the solderable layer 28. The printed circuit board 32/package assembly 30 is then heated to a temperature sufficient to melt the solder 38, fusing the package assembly 30 to the printed circuit board 32.

Figure 2:
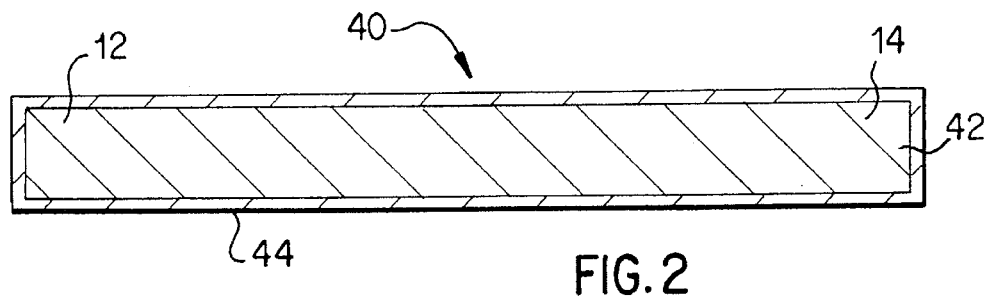
FIG. 2 shows in cross-sectional representation a leadframe lead prepared according to a first embodiment of the invention.

The process of the present invention significantly reduces the steps required to manufacture an electronic package and reduces the risk of damage to the polymer resins and other components of the package. FIG. 2 illustrates in cross-sectional representation a lead treated in accordance with the process of the invention. The process provides a leadframe 40 having a metallic substrate 42 formed into a plurality of leads. The metallic substrate 42 may be any suitable electrically conductive material such as copper, copper alloys and iron-nickel alloys. Particularly well suited are copper alloys C110 (electrolytic tough pitch copper having the nominal composition, by weight, 99.90% copper and a maximum of 0.05% oxygen) and C7025 (nominal composition, by weight, 3.0% nickel, 0.65% silicon, 0.15% magnesium and the balance copper). The lead 40 has an inner lead end 12 and an outer lead end 14. The inner lead end 12 is for subsequent electrical interconnection to an integrated circuit device while the outer lead end 14 is for subsequent soldering to external circuitry. The lead 40 is coated with an oxidation resistant layer 44 which is both adherent to polymer resins used in the electronic package assembly and removable by a process which does not detrimentally effect the package components. Preferred oxidation resistant layers 44 are zinc and zinc alloys. One particularly suitable zinc alloy includes zinc and chromium with a zinc to chromium ratio, by weight, in excess of about 4:1. Such a coating may be electrolytically codeposited as in U.S. Pat. No. 5,098,796 to Lin et al. which is incorporated by reference herein. The lead 40 is immersed in an electrolyte containing 0.1–100 grams per liter chromium VI ions and 0.07–7 grams per liter zinc ions in an aqueous solution having a basic pH. Preferred salts for providing the chromium VI ions include sodium dichromate and for providing the zinc ions, zinc oxide. A voltage is impressed across the leads with the leads serving as the cathode for a time sufficient to provide an effective thickness of the zinc/chromium oxidation resistant layer. An effective thickness is that which prevents oxidation of the metallic substrate 42, while improving adhesion and which is readily removed in a dilute (approximately 4 volume percent) aqueous solution of sulfuric acid. A preferred thickness is from about 10 angstroms to about 0.1 microns angstroms and a most preferred thickness is from about 10 angstroms to about 100 angstroms.

Figure 3:
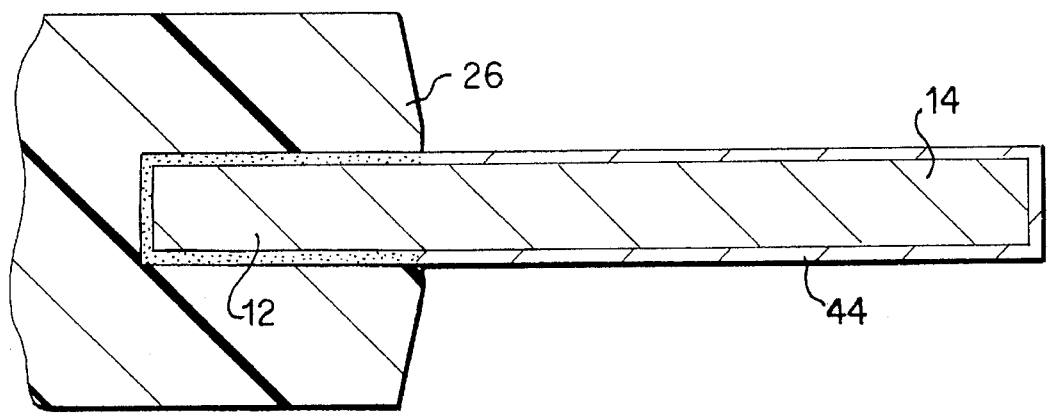
FIG. 3 shows in cross-sectional representation the encapsulation of the inner lead end of a leadframe in molding resin.

As shown in FIG. 3, the inner lead end 12 is next encapsulated such as in a polymer resin 26, as disclosed in copending U.S. patent application Ser. No. 07/822,373 by Parthasarathi et al, filed Jan. 17, 1992 which is incorporated by reference herein. Adhesion is by means of a chemical bond between the polymer resin 26 and the oxidation resistant layer 44. As a result, that portion of the oxidation resistant layer 44 contacting the polymer resin 26, as indicated by cross-hatching, is not readily removed by immersion in dilute sulfuric acid. The outer lead portions 14 are protected by the oxidation resistant layer 44 and no base metal oxidation occurs during polymer molding.

Figure 4:
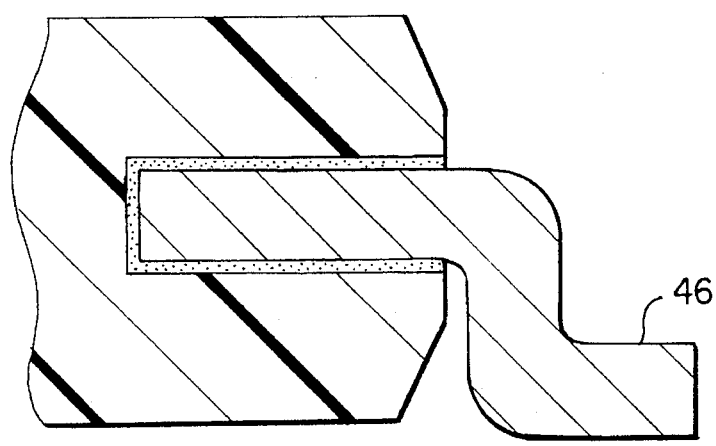
FIG. 4 shows in cross-sectional representation the preparation of the outer lead end for soldering.

As shown in cross-sectional representation of FIG. 4, the outer lead portion 14 is then formed, bent to a desired shape, and a portion of the oxidation resistant layer 44 removed from the outer lead portions 14 by any means which does not affect the other electronic package components. For the zinc chromium alloy coatings of the preferred embodiments, the entire package is immersed in a 4% by volume aqueous sulfuric acid solution for from about 5 seconds to about 60 seconds. The exposed metallic surface 46 may then be soldered to a printed circuit board. Because the metallic surface 46 readily oxidizes, soldering should be commenced rapidly, generally within about 24 hours following removal of the oxidation resistant layer. Any suitable low melting temperature solder may be utilized such as lead/tin alloys with or without a flux.

FIG. 5 illustrates in cross-sectional representation a lead 50 of a leadframe in accordance with a second embodiment of the invention. The lead 50 has a metallic substrate 42 and an oxidation resistant layer 44 as with the preceding embodiment. An intervening layer 52 is disposed between at least a portion of the metallic substrate 42 and the oxidation resistant layer 44. The intervening layer 52 is any material which is more oxidation resistant than the metallic substrate 42 and may be a metal, metal alloy, metal compound or polymer. Nickel and nickel alloys are most preferred. Preferably, the intervening layer 52 coats all portions of the metallic substrate 42 except for that portion of the outer lead end 14 which will contact the solder. When the oxidation resistant layer 44 is removed, an oxide free portion of the metallic substrate 42 is exposed for soldering. The remainder of the lead is protected from oxidation during and subsequent to soldering by the intervening layer 52.

When the intervening layer 52 is nickel, a thickness of from about 1 to about 5 microns is effective to prevent oxidation of the underlining metallic substrate. Preferably, the thickness of the nickel layer 52 is from about 2 to about 4 microns. This nickel layer may be deposited by any suitable means such as electrolytically. For a copper alloy substrate, one suitable electrolyte is an aqueous solution containing 263–450 grams per liter nickel sulfamate and 30–45 grams per liter boric acid at a pH of 3–5. The lead 50 is immersed in an electrolytic cell containing the electrolyte and a voltage impressed with the lead 50 being the cathode at a current density of 2.5–30 A/dm$^2$ for a time sufficient to deposit an effective thickness of the intervening layer 52.

To improve the adhesion of the wire bond, particularly when the intervening layer 52 is nonmetallic, a bond pad 54 is formed on the inner lead end 12. The bond pad 54 is a metal such as silver, aluminum, nickel or an alloy thereof. If the intervening layer 52 is not electrically conductive, a conductive via 56 electrically interconnects the bond pad 54 with the metallic substrate 42. Preferably, the bond pad 54 is silver with a thickness of from about 0.5 to about 4 microns. The oxidation resistance of silver is high, therefore it is not necessary for the oxidation resistant layer to coat that portion of the inner lead end 12 which is covered by the bond pad. Since most wire bonding technology is drawn to direct bonding to silver, it may be preferred not to coat the bond pad with the oxidation resistant layer.

FIG. 6 shows in cross-sectional representation an electronic package assembly 30 bonded to a printed circuit board 32 by solder 38 utilizing the lead 50 of the invention. The solder 38 bonds that portion of the outer lead end 14 which is free of the intervening 52 to a circuit trace 36.

Figure 7:
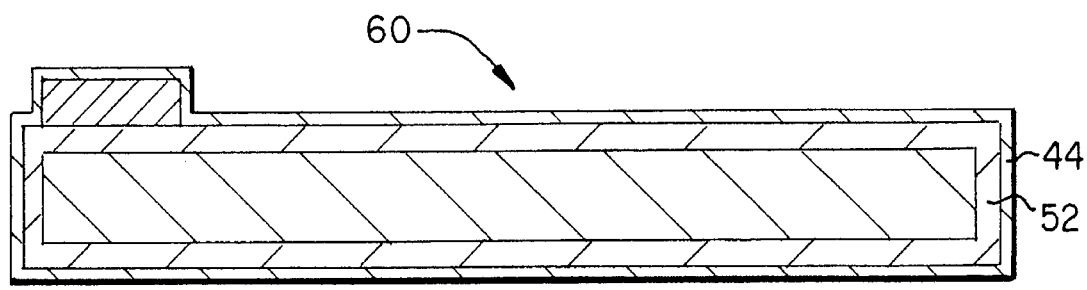
FIG. 7 shows in cross-sectional representation a leadframe lead prepared according to a third embodiment of the invention.

FIG. 7 shows in cross-sectional representation a lead 60 in accordance with a third embodiment of the invention. The intervening layer 52 is formed from a solderable metallic material such as nickel, tin and alloys thereof. The intervening layer 52 coats all surfaces of the lead 60. As with preceding embodiments, the oxidation-resistant layer 44 is removed immediately preceding soldering. Soldering is directly to the intervening layer.

Figure 8:
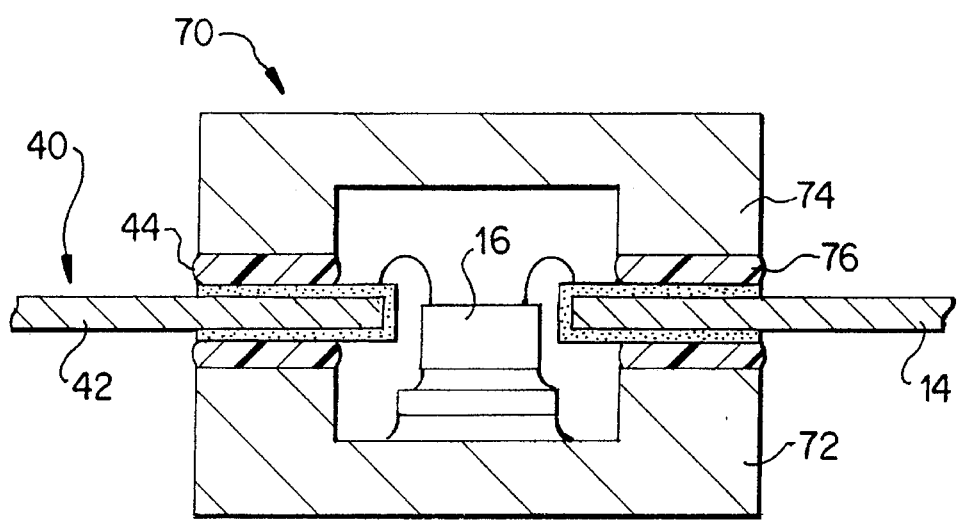
FIG. 8 shows in cross-sectional representation a semiconductor package utilizing the leadframe of the invention.

The process of the invention is equally applicable to electronic packages 70 as illustrated in cross-sectional representation in FIG. 8, which include discrete base 72 and cover 74 components. The leads 40 have a metallic substrate 42 initially coated with an oxidation resistant layer 44. The leads 40 are disposed between and bonded to both the base component 72 and cover component 74 by means of a bonding agent 76. The bonding agent 76 may be any suitable electrically nonconductive material such an polymer adhesive or a sealing glass. Preferably, the bonding agent 76 is a thermosetting epoxy. When the leads 40 are bonded to the bonding agent 76, a chemical bond makes that portion of the oxidation resistant layer 44 contacting the bonding agent 76 essentially nonreactive with dilute sulfuric acid. As the result, the oxidation resistant layer 44 is removed only from the outer lead ends 14 when the package 70 is immersed in dilute sulfuric acid.

The base component 72 and cover component 74 may be formed from any suitable material, including polymers, ceramics and metals. For improved removal of heat from the integrated circuit device 16, the base component 72 is preferably formed from copper, aluminum or an alloy thereof. Most preferably, both the base component 72 and cover component 74 are formed from an aluminum alloy which has been anodized for enhanced corrosion resistance.

EXAMPLE

The following example illustrates the benefit of the process of the invention. Copper alloy C7025 leadframes were coated with an oxidation resistant layer of chromium and zinc by the method described above. The samples were then heat treated at 190° C. for 90 minutes in air. The oxidation resistant coating was then removed by immersion for 30 seconds in 5 weight percent hydrochloric acid at room temperature. The samples were then dipped in a lead-tin alloy solder bath and the solderability evaluated by measuring the percent of surface covered by the solder. C7025 samples which were not treated according to the process of the invention exhibited less than 50% solder coverage. Those treated according to the process of the invention exhibited from 95–99% solder coverage.

While the invention has been described in terms of leaded packages such as dual-in-line packages or quad flat packs, the process is equally applicable to other types of electronic packages which require soldering to a printed circuit board following package assembly. Other packages which may be improved by the process of the invention include leadless chip carriers, multichip modules, pin grid array packages and ball grid array packages.

The patents and patent application set forth in this specification are intended to be incorporated by reference.

It is apparent that there has been provided in accordance with this invention a process for the manufacture of an electronic package which fully satisfies the objects, features and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A method for the manufacture of an electronic package, comprising the steps of:
   (a) providing a leadframe having inner and outer lead ends;
   (b) coating at least a portion of said leadframe with an intervening layer selected to be more oxidation resistant than said leadframe while maintaining that portion of said outer lead ends which are adapted to receive a solder as substantially free of said intervening layer;
   (b) coating said leadframe with an oxidation resistant layer;

(c) encapsulating said inner lead ends; and (d) removing a portion of said oxidation resistant layer overlying said outer lead ends.

2. The method of claim 1 including selecting said leadframe to be copper or a copper alloy, said intervening layer to be nickel or a nickel alloy and said oxidation resistant layer to include codeposited chromium and zinc.

3. The method of claim 2 including step g) subsequent to step d), step g) comprising soldering said oxidation resistant layer free outer lead ends to external circuitry.

4. A method for the manufacture of an electronic package, comprising the steps of:

(a) providing a leadframe of copper or a copper base alloy;

(f) coating said leadframe with an intervening layer of tin or a tin alloy;

(b) coating said leadframe with an oxidation resistant layer selected to include codeposited chromium and zinc;

(c) encapsulating said inner lead ends; and (d) removing a portion of said oxidation resistant layer overlying said outer lead ends.

5. The method of claim 4 including step g) subsequent to step d), step g) comprising soldering said oxidation resistant layer free outer lead ends to external circuitry.

* * * * *